(12) United States Patent
Nonaka

(10) Patent No.: US 8,956,465 B2
(45) Date of Patent: Feb. 17, 2015

(54) LIQUID PROCESSING METHOD, LIQUID PROCESSING DEVICE, AND STORAGE MEDIUM

(71) Applicant: Tokyo Electron Limited, Tokyo (JP)

(72) Inventor: Jun Nonaka, Kumamoto (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 14/344,085

(22) PCT Filed: Jan. 11, 2013

(86) PCT No.: PCT/JP2013/050409
§ 371 (c)(1),
(2) Date: Mar. 11, 2014

(87) PCT Pub. No.: WO2013/132881
PCT Pub. Date: Sep. 12, 2013

(65) Prior Publication Data
US 2014/0338706 A1    Nov. 20, 2014

(30) Foreign Application Priority Data

Mar. 6, 2012  (JP) ................................. 2012-049293

(51) Int. Cl.
*B08B 3/02* (2006.01)
*B08B 3/04* (2006.01)
*B08B 3/10* (2006.01)
*H01L 21/67* (2006.01)
*H01L 21/02* (2006.01)

(52) U.S. Cl.
CPC .... *H01L 21/67051* (2013.01); *H01L 21/02052* (2013.01); *Y10S 134/902* (2013.01)
USPC .............. 134/30; 134/32; 134/151; 134/157; 134/199; 134/902; 34/317

(58) Field of Classification Search
USPC .......... 134/30, 32, 151, 157, 199, 902; 34/317
See application file for complete search history.

(56) References Cited

FOREIGN PATENT DOCUMENTS

| JP | 07-273083 A | 10/1995 |
|---|---|---|
| JP | 2005-340661 A | 12/2005 |
| JP | 2010-258068 A | 11/2010 |
| JP | 2011-135002 A | 7/2011 |
| JP | 2012-044144 A | 3/2012 |
| KR | 10-2011-0120208 A | 11/2011 |

OTHER PUBLICATIONS

International Search Report issued on Apr. 16, 2013 for WO 2013/132881 A1.

*Primary Examiner* — Michael Kornakov
*Assistant Examiner* — Natasha Campbell
(74) *Attorney, Agent, or Firm* — Abelman, Frayne & Schwab

(57) ABSTRACT

[Problem] To provide a liquid processing method with which, while alleviating a watermark occurring in the surface of a substrate, it is possible to hydrophobize the surface using a hydrophobing gas. [Solution] A substrate (W), retained in substrate retaining parts (21, 22, 23), is rotated and has a liquid compound supplied to the surface thereof, whereby a liquid process is carried out. Next, a rinse liquid is supplied to the surface of the substrate (W) while the substrate (W) is rotated, and the liquid compound is replaced with the rinse liquid. Next, supplying a hydrophobing gas for hydrophobizing the surface of the substrate (W) and supplying the rinse liquid to the surface of the substrate (W) after supplying the hydrophobing gas are repeated alternately, thus hydrophobizing the substrate (W). Next, the rinse liquid is removed by rotating the substrate (W), drying the substrate (W).

12 Claims, 6 Drawing Sheets

LIQUID PROCESSING METHOD, LIQUID PROCESSING DEVICE, AND STORAGE MEDIUM

CROSS REFERENCE TO RELATED APPLICATIONS

This application is a national phase of PCT application No. PCT/JP2013/050409, filed on Jan. 11, 2013, which claims priority to Japanese patent application No. 2012-049293, filed on Mar. 6, 2012, all of which are incorporated herein by reference.

TECHNICAL FIELD

The present disclosure relates to a technology of hydrophobizing a substrate which has been subjected to a liquid processing.

BACKGROUND

In a single-wafer type spin cleaning device (liquid processing device) configured to perform a liquid processing on a semiconductor wafer (hereinafter, referred to as a "wafer") as a substrate, for example, an alkaline or acidic chemical liquid is supplied to the surface of the wafer while the wafer is being rotated such that the chemical liquid is spread over the surface of the wafer to remove, for example, dusts or native oxides, on the surface of the wafer. The chemical liquid remaining on the surface of the wafer is removed by, for example, a rinsing liquid. Then, when the supply of the rinsing liquid is stopped while the wafer is being rotated, the remaining rinsing liquid may be shaken off to obtain the wafer in a dried state.

However, according to a high integration or a high aspect ratio of a semiconductor device, a problem of a so-called pattern collapse has been increased, for example, in a process of removing the above described rinsing liquid. The pattern collapse refers to a phenomenon in which, when a rinsing liquid entering into a pattern is shaken off, the liquid remaining at the left and right sides of, for example, a convex portion of an unevenness which forms the pattern is unevenly dried, and then the balance of surface tension that pulls the convex portion in the left and right directions is lost and thus the convex portion is collapsed in a direction in which the liquid remains in a large amount.

As a method of removing a rinsing liquid remaining on a surface of a wafer while suppressing the occurrence of a pattern collapse, there is provided a technology of hydrophobizing the surface of the wafer so as to increase a contact angle between the wafer and the rinsing liquid, thereby reducing a surface tension which acts on a pattern (Patent Document 1).

In the technology disclosed in Patent Document 1, a wafer as an object to be processed comes in contact with a liquid of a hydrophobic agent to hydrophobize the surface of the wafer. Meanwhile, since some hydrophobic agents are expensive, there are attempts to hydrophobize the surface of the wafer by using a vaporized hydrophobic agent or a gas including mists of a hydrophobic agent (hereinafter, referred to as a "hydrophobic gas") so that the amount of a hydrophobic agent to be used is reduced (Patent Document 2).

The inventor has developed a technology of hydrophobizing a wafer surface by using a hydrophobic gas, and newly has found that in some cases, the wafer surface which has been processed by a hydrophobic gas and then rinsed is contaminated with multiple particles.

PRIOR ART DOCUMENT

Patent Document

Patent Document 1: Japanese Patent Laid-Open Publication H7-273083: Paragraphs 0027 and 0053 to 0055, FIG. 2

Patent Document 2: Japanese Patent Laid-Open Publication No. 2010-258068: Paragraph 0035, FIG. 4A

DISCLOSURE OF THE INVENTION

Problems to be Solved

The present disclosure has been made in consideration of such circumstances, and an object of the present disclosure is to provide a liquid processing method and a liquid processing device which is capable of hydrophobizing a surface of a substrate using a hydrophobic gas while suppressing occurrence of watermarks on the surface of the substrate, and a storage medium which stores the liquid processing method.

Means to Solve the Problems

A liquid processing method of the present disclosure is a liquid processing method using a liquid processing device which includes a substrate holding unit configured to horizontally hold a substrate and to rotate the substrate around a vertical axis, a chemical liquid nozzle configured to supply a chemical liquid to a surface of the substrate, a hydrophobic gas nozzle configured to supply a hydrophobic gas to the surface of the substrate, and a rinsing liquid nozzle configured to supply a rinsing liquid to the surface of the substrate. The liquid processing method includes: supplying the chemical liquid from the chemical liquid nozzle to the surface of the substrate which is held and rotated by the substrate holding unit to perform a liquid processing; supplying the rinsing liquid from the rinsing liquid nozzle to the surface of the substrate while rotating the substrate to replace the chemical liquid by the rinsing liquid; hydrophobizing the substrate by alternately repeating supply of the hydrophobic gas for hydrophobizing the surface of the substrate to the surface of the substrate from the hydrophobic gas nozzle while rotating the substrate and supply of the rinsing liquid to the surface of the substrate while rotating the substrate after the hydrophobic gas is supplied; and drying the substrate by removing the rinsing liquid through rotation of the substrate.

In the liquid processing method of the present disclosure, during the hydrophobizing of the substrate, a following supply of the rinsing liquid is initiated before the rinsing liquid on the surface of the substrate, which is being supplied with the hydrophobic gas, is dried.

In the liquid processing method of the present disclosure, the substrate has a pattern formed on the surface of the substrate, and, during the hydrophobizing of the substrate, the hydrophobic gas is caused to enter into the pattern while gradually lowering a position of a liquid level of the rinsing liquid present within the pattern formed on the substrate of the substrate so that an area of a hydrophobized region is gradually widened in a depth direction of the pattern.

In the liquid processing method of the present disclosure, the hydrophobizing of the substrate is completed by supplying the rinsing liquid to the surface of the substrate, and the number of revolutions of the substrate during the drying of the substrate is lower than the number of revolutions of the substrate during the hydrophobizing of the substrate.

In the liquid processing method of the present disclosure, the hydrophobizing of the substrate is completed by supplying the rinsing liquid to the surface of the substrate, the number of revolutions of the substrate during the drying of the substrate is lower than the number of revolutions of the substrate during the hydrophobizing of the substrate, and during the drying of the substrate, the rinsing liquid is supplied to the surface of the substrate which rotates while a supply position of the rinsing liquid is moved from a position above a central portion of the substrate toward a circumferential edge so that the rinsing liquid on the surface of the substrate is pushed out to outside of the substrate to be removed.

The liquid processing method of the present disclosure further includes removing byproducts of the hydrophobic gas by supplying a solvent to the surface of the substrate, between the hydrophobizing of the substrate and the drying of the substrate.

In the liquid processing method of the present disclosure, the substrate has a pattern formed on the surface of the substrate, and the number of alternate repetitions of the supply of the rinsing liquid to the surface of the substrate and the supply of the hydrophobic gas to the surface of the substrate is set so that a contact angle of the rinsing liquid with respect to a surface portion of the substrate not formed with the pattern is a predetermined angle or more A storage medium of the present disclosure is a computer-readable storage medium storing a computer program that when executed, causes a liquid processing device configured to perform liquid processing on a surface of a substrate to execute the above described liquid processing method.

A liquid processing device of the present disclosure includes: a substrate holding unit configured to horizontally hold a substrate and to rotate the substrate around a vertical axis; a chemical liquid nozzle configured to supply a chemical liquid to a surface of the substrate; a hydrophobic gas nozzle configured to supply a hydrophobic gas to the surface of the substrate; a rinsing liquid nozzle configured to supply a rinsing liquid to the surface of the substrate; and a control unit configured to causes the liquid processing device to execute supplying the chemical liquid from the chemical liquid nozzle to the surface of the substrate which is held and rotated by the substrate holding unit, supplying the rinsing liquid from the rinsing liquid nozzle to the surface of the substrate while rotating the substrate, hydrophobizing the substrate by alternately repeating supply of the hydrophobic gas for hydrophobizing the surface of the substrate to the surface of the substrate from the hydrophobic gas nozzle while rotating the substrate and supply of the rinsing liquid to the surface of the substrate while rotating the substrate after the hydrophobic gas is supplied, and drying the substrate by removing the rinsing liquid while rotating the substrate by rotating the substrate holding unit.

In the liquid processing device of the present disclosure, during the hydrophobizing of the substrate, the control unit causes a following supply of the rinsing liquid to be initiated before the rinsing liquid on the surface of the substrate, which is being supplied with the hydrophobic gas, is dried.

In the liquid processing device of the present disclosure, the control unit causes the hydrophobizing of the substrate to be completed by supplying the rinsing liquid to the surface of the substrate, and sets the number of revolutions of the substrate during the drying of the substrate to be lower than the number of revolutions of the substrate during the hydrophobizing of the substrate.

The liquid processing device of the present disclosure further includes a solvent nozzle configured to supply a solvent to the surface of the substrate, and the control unit causes the solvent to be supplied from the solvent nozzle to the surface of the substrate between the hydrophobizing of the surface of the substrate and the drying of the substrate.

Effect of the Invention

In the present disclosure, supply of a hydrophobic gas and supply of a rinsing liquid to a surface of a substrate are alternately repeated while droplets is remaining on the substrate without being dried, so that a hydrophobized region on the surface of the substrate is gradually widened to suppress occurrence of watermarks.

DETAILED DESCRIPTION TO EXECUTE THE INVENTION

Figure 1:
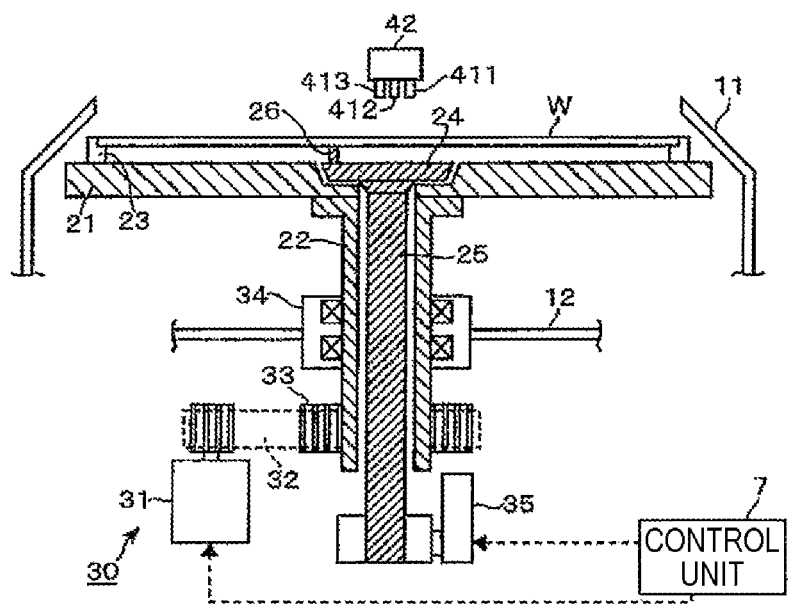
FIG. 1 is a vertical cross-sectional view of a liquid processing device according to an exemplary embodiment.

The configuration of a liquid processing device according to an exemplary embodiment of the present disclosure will be described with reference to FIGS. 1 and 2. As illustrated in FIG. 1, the liquid processing device includes a disk-shaped support plate 21 provided with a plurality of supporting pins 23, for example, three supporting pins 23, which horizontally support a wafer W, and a rotation shaft 22 which is connected to the bottom surface of the support plate 21 to extend vertically. The support plate 21, the supporting pins 23, and the rotation shaft 22 correspond to a substrate holding unit of the present liquid processing device.

A pulley 33 is provided at a lower end side of the rotation shaft 22, and a rotation motor 31 is disposed at a lateral side of the pulley 33. A driving belt 32 is wound on the pulley 33 and a rotation shaft of the rotation motor 31 to constitute a rotation driving unit 30 which rotates the wafer W on the support plate 21 around a vertical axis. The rotation motor 31 may vary a rotation speed of the support plate 21, that is, a rotation speed of the wafer W supported by the support plate 21. The rotation shaft 22 is fixed via a bearing 34 to a floor board 12 of a casing in which the liquid processing device is disposed.

The support plate 21 has a central portion that is cut out in a circular shape, and a disk-shaped elevating plate 24 is disposed within the cut-out portion. A plurality of lift pins 26, for example, three lift pins 26, are provided on the top surface of the elevating plate 24. The lift pins 26 are configured to support the wafer W from the rear surface (bottom surface) side during delivery of the wafer W to/from an external wafer conveyance mechanism.

A lift shaft 25 which penetrates vertically the inside of the rotation shaft 22 is connected to the bottom surface of the elevating plate 24, and an elevating mechanism 35 configured to move up and down the lift shaft 25 is provided at the lower end of the lift shaft 25.

A cup 11 configured to cover the wafer W supported by the supporting pins 23 from the circumferential side and the diagonal upper side of the wafer W is provided at the outside of the support plate 21.

The liquid processing device of the present exemplary embodiment supplies a chemical liquid to a surface of a wafer W in a switching manner to perform a liquid processing on the surface. In the present exemplary embodiment, as the chemical liquid, SC-1 (a mixed aqueous solution of ammonia and hydrogen peroxide) for removing organic pollutants or particles attached on the surface of the wafer W is used.

The liquid processing device includes a liquid nozzle 411 as a supply unit of a chemical liquid. The liquid nozzle 411 serves to supply a chemical liquid (SC-1) and DIW which is a rinsing liquid to a central portion of the front surface (top surface) of the wafer W which rotates. The liquid nozzle 411 corresponds to a chemical liquid nozzle in terms of supplying the chemical liquid, and corresponds to a rinsing liquid nozzle in terms of supplying the rinsing liquid.

The present liquid processing device is provided with a gas nozzle 412 and an IPA nozzle 413. The gas nozzle 412 is configured to supply a gas of a silylating agent (hydrophobic gas) which is a kind of a hydrophobic agent, and $N_2$ gas used for drying the wafer W to the surface of the wafer W, and the IPA nozzle 413 is used after the supply of the hydrophobic gas and is configured to supply IPA (Isopropyl Alcohol) which is a kind of a processing liquid. The gas of the silylating agent and the $N_2$ gas, and the IPA are supplied to the gas nozzle 412 and the IPA nozzle 413, respectively, through different flow paths from a flow path for the chemical liquid or the DIW.

These nozzles 411 to 413 are provided on the bottom surface side of a nozzle block 42, and the nozzle block 42 is attached to a distal end portion of a nozzle arm 43. A base end portion of the nozzle arm 43 is supported by a slider 44 which freely travels on a guide rail 45. By moving the slider 44 between one end and the other end of the guide rail 45, the nozzle block 42 (that is, the liquid nozzle 411, the gas nozzle 412 and the IPA nozzle 413) may be moved between a position (indicated by the solid line in FIG. 2) above the central portion of the wafer W (a rotation center of the wafer W), and a position (indicated by the one-dot chain line in FIG. 2) retreated laterally from the position above the wafer W. For convenience, illustration of the cup 11 is omitted in FIG. 2, but the position to which the nozzle block 42 is retreated is set to be more outside than the cup 11. Here, the liquid nozzle 411, the gas nozzle 412, and the IPA nozzle 413 are not limited to the case where they are provided in the common nozzle block 42. Each of the liquid nozzle 411, the gas nozzle 412, and the IPA nozzle 413 may individually employ, for example, a dedicated nozzle block or a dedicated moving mechanism.

A liquid flow path and a gas flow path (not illustrated), each of which is connected to the liquid nozzle 411, the gas nozzle 412, or the IPA nozzle 413, are provided in the nozzle arm 43 or the nozzle block 42.

The flow path connected to the liquid nozzle 411 is connected to a DIW supply unit 64, and a chemical liquid supply unit 65 each of which is provided with a tank of each processing liquid (a chemical liquid or DIW) and a flow rate control mechanism.

When opening/closing valves V4 and V5 provided in connecting tubes which connect the liquid flow path to the supply units 64 and 65 of the respective processing liquids are opened or closed, the respective processing liquids may be supplied from the liquid nozzle 411 to the wafer W in a switching manner.

The flow path connected to the gas nozzle 412 is connected to a TMSDMA supply unit 62 and a $N_2$ gas supply unit 63. The TMSDMA supply unit 62 is provided with a chemical liquid tank of trimethyl silyl dimethyl amine (hereinafter, referred to as "TMSDMA") which is a silylating agent or a gasification mechanism configured to gasify TMSDMA through vaporization, and a flow rate control mechanism. The $N_2$ gas supply unit 63 is provided with a $N_2$ gas cylinder and a flow rate control mechanism thereof.

When opening/closing valves V2 and V3 provided in connecting tubes which connect the gas flow path to the supply units 62 and 63 of the TMSDMA gas and the $N_2$ gas, the TMSDMA gas and the $N_2$ gas may be supplied from the gas nozzle 412 to the wafer W are opened or closed in a switching manner. The gas nozzle 412 corresponds to a hydrophobic gas nozzle in terms of supplying a hydrophobic gas (TMSDMA gas).

The TMSDMA hydrophobizes the surface of the wafer W by silylation of the surface, and thus serves to increase the contact angle between the wafer W and the DIW when the DIW used for rinsing is removed. As a result, a force which acts on a pattern formed on the surface of the wafer W is reduced, and thus, the DIW may be removed without causing pattern collapse. In the present exemplary embodiment, silylation indicates a process of hydrophobizing the surface of the wafer W by replacing hydrophilic functional groups bonded to Si atoms on the surface of the wafer W, for example, OH groups, with hydrophobic functional groups including Si atoms. The TMSDMA is replaced with trimethyl silyl groups.

The TMSDMA is stored in the tank within the TMSDMA supply unit 62, for example, in a liquid state, heated by, for example, a heater mechanism to be gasified, and diluted by a carrier gas (for example, $N_2$ gas is used) supplied from a carrier gas supply unit 621 to be supplied to the gas nozzle 412.

The flow path connected to the IPA nozzle 413 is connected to an IPA supply unit 61 which is provided with a tank of IPA as a solvent and a flow rate control mechanism. When the opening/closing valve V1 provided in a connecting tube which connects the liquid flow path to the IPA supply unit 61 is opened or closed, the IPA may be supplied from the IPA nozzle 413 to the wafer W. As described below, since the IPA is used as a solvent, the IPA nozzle 413 corresponds to a solvent nozzle.

Figure 2:
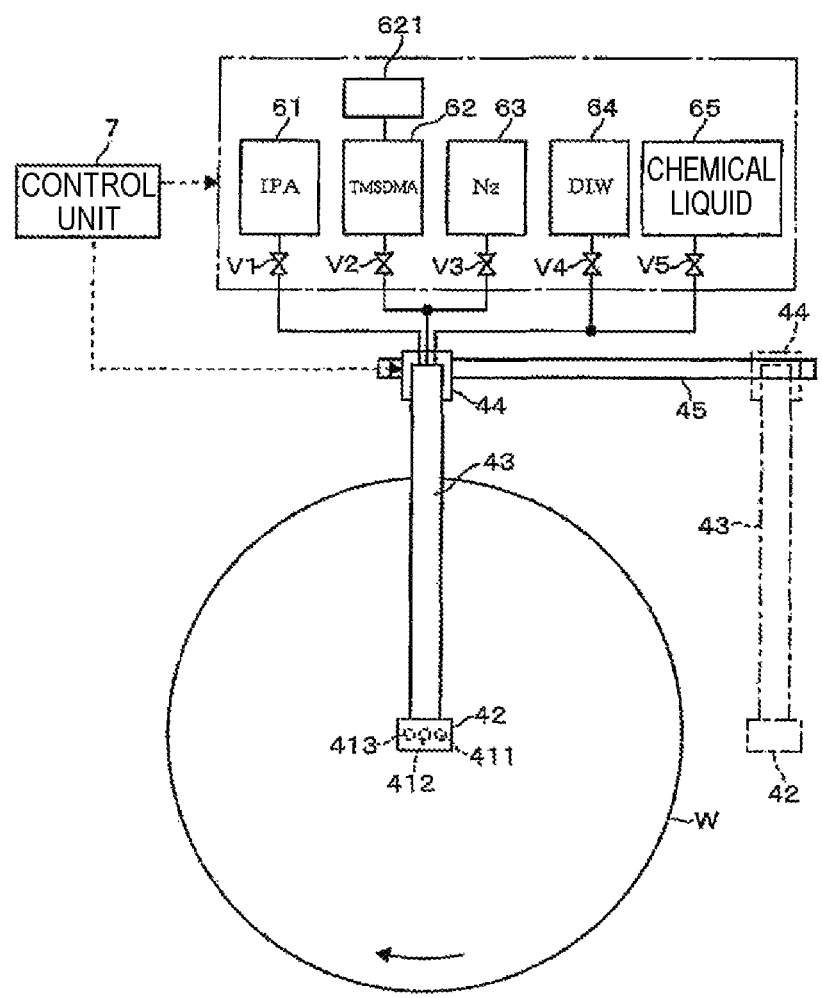
FIG. 2 is a plan view of the liquid processing device.

The liquid processing device provided with the above described configuration is connected to a control unit 7 as illustrated in FIGS. 1 and 2. The control unit 7 includes, for example, a computer (not illustrated) provided with a CPU and a storage unit. The storage unit stores a program in which a group of steps (commands) for controlling the operation of the liquid processing device are set up. The operation includes rotating a wafer W supported by the support plate 21, performing a liquid processing, hydrophobizing, and/or drying of the wafer W by supplying processing liquids in a switching manner based on a predetermined schedule, and then performing carrying-out of the wafer W. The program is stored in a storage medium such as, for example, a hard disk, a compact disk, a magneto-optical disk, and a memory card, and is installed to the computer therefrom.

The control unit 7 may control, for example, a supply timing or a supply time or amount, of for example, a TMS-DMA gas, DIW or IPA, and a rotation speed of the wafer W, thereby reducing particle contamination as described in the background art which occurs when the surface of the wafer W is hydrophobized by using a hydrophobic gas.

In relation to a cause of particle generation, the inventor has found that the particles are formed by the following mechanism.

The particles are generated mainly due to watermarks which are generated because droplets on the surface of the wafer W are dried when a hydrophobic gas is supplied. For example, a processing sequence may be thought to be performed as follows: after a chemical liquid processing, DIW is supplied to the surface of a rotating wafer W to perform replacement with a chemical liquid and rinsing, and subsequently, a hydrophobic gas is continuously supplied to hydrophobize the entire surface of the wafer W and to remove the rinsing liquid.

It is desirable that the wafer W is rotated at a rotation speed of, for example, 1000 rpm or more so that the hydrophobic gas continuously supplied subsequently to the rinsing is thoroughly spread over the surface of the wafer W to hydrophobize the entire surface of the wafer W as described. According to the rotation, the hydrophobic gas is thoroughly spread over the surface of the wafer W along the swirling flow formed on the surface of the wafer W. Meanwhile, when the hydrophobic gas is supplied at a low rotation speed of for example, less than 500 rpm, there exists an unexposed portion of a pattern surface from which the rinsing liquid is not shaken off, which suppress the hydrophobic gas from entering into a pattern. Thus, there remains an unhydrophobized region.

Meanwhile, it can be seen that, when the wafer W is rotated at a relatively high speed as described above, a part of DIW remains as fine droplets when the DIW is shaken off from the surface of the wafer W. When the droplets are dried on the surface of the wafer W, the droplets form watermarks to become particles which contaminate the wafer W.

Accordingly, the liquid processing device of the present exemplary embodiment performs a processing of gradually widening a hydrophobized region on the surface of the wafer W in a radial direction of the wafer W and a depth direction within a pattern by repeating alternately the supply of DIW and the supply of a TMSDMA gas (hydrophobic gas) so as to spread the hydrophobic gas on the entire surface of the wafer W and suppress watermarks from being formed. Further, the liquid processing device has a function of reducing the rotation speed of the wafer W when the wafer W is dried, so as to suppress fine droplets from remaining on the surface of the wafer W. Detailed descriptions of these processings will be made in the following operational description.

Figure 3:
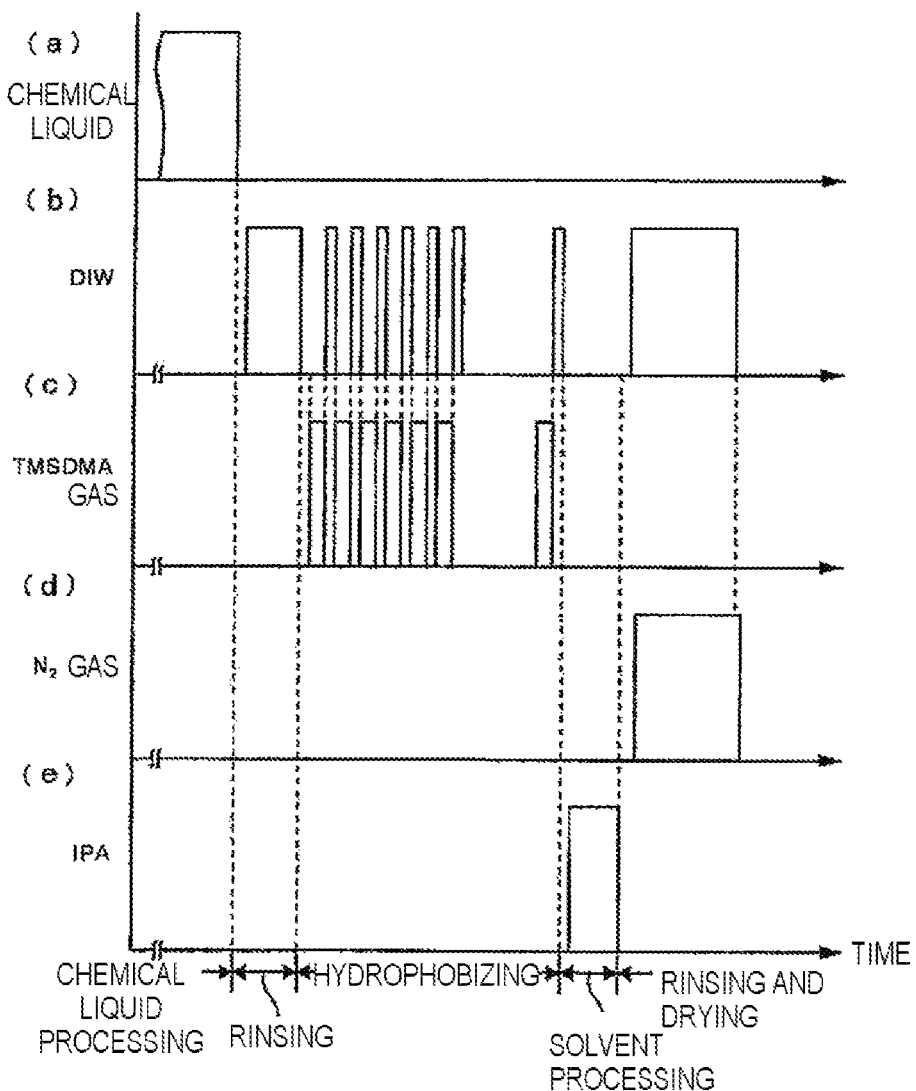
FIG. 3 is an explanatory view illustrating supply timings of processing liquids and gases to a wafer.

Hereinafter, the operation of the liquid processing device having these functions will be described with reference to FIG. 3 which illustrates supply timings of various kinds of processing liquids and gases, and FIGS. 4 to 8 which schematically illustrate the state of the surface of a wafer W during processings. Sections (a) to (e) of FIG. 3 schematically illustrate supply/stop timings of the processing liquids or the gases from respective nozzles 411 to 413 with elapse of time, but do not exactly illustrate the periods of time for supplying the processing liquids or the gases.

The liquid processing device stands by in a state where the nozzle block 42 is retracted to the outside of the cup 11 and the support plate 21 is stopped. When an external wafer conveyance mechanism advances a fork which holds a wafer W to a position above the support plate 21, the elevating plate 24 is moved up to intersect with the fork so that the wafer W is delivered to the lift pins 26 of the elevating plate 24.

After the fork is retreated from the position above the support plate 21, the elevating plate 24 is moved down such that the wafer W is placed on the supporting pins 23 of the support plate 21. Then, the rotation motor 31 is operated so that the wafer W on the support plate 21 is rotated. Then, when the rotation speed of the wafer W reaches a predetermined speed, the nozzle block 42 is moved to a position above the central portion of the wafer W.

Figure 4:
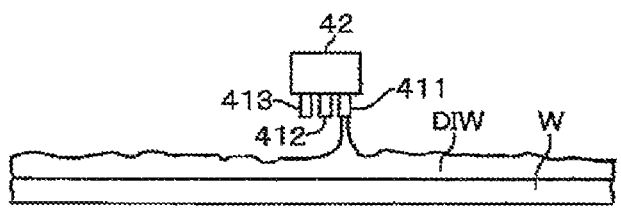
FIG. 4 is a first explanatory view illustrating an operation of the liquid processing device.

Then, SC-1 is supplied from the liquid nozzle 411 for a predetermined time to remove organic pollutants or particles. Subsequently, the rotation speed of the wafer W is increased, and the processing liquid to be supplied from the liquid nozzle 411 is switched to DIW so as to perform rinsing, and wash away the SC-1 on the surface of the wafer W (FIG. 4).

When the SC-1 is washed away by the DIW, the supply of the DIW is stopped.

Then, as illustrated in a period of "hydrophobizing" in sections (b) and (c) of FIG. 3, a process of hydrophobizing gradually the surface of the wafer W is performed by alternately supplying a TMSDMA gas and DIW toward the center of the wafer W. Here, the rotation speed of the wafer W is set to be a rotation speed that enables the TMSDMA gas to be uniformly spread over the surface of the wafer W, for example, 1000 rpm or more.

For example, in a case of a wafer W with a diameter of 300 mm, in the hydrophobizing, the TMSDMA gas is supplied at a supply rate in a range of 5 to 20 l/min (under standard conditions of 0° C. and 1 atm) for a time in a range of 0.5 to 2 sec, for example, at 5 l/min for 1 sec. The DIW is supplied at a supply rate in a range of 1 to 3 l/min for a time in a range of 0.5 to 5 sec, for example, at 2 l/min for 0.5 sec.

Figure 5:
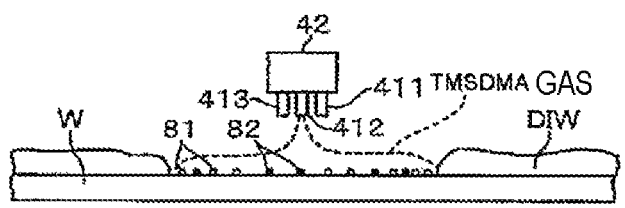
FIG. 5 is a second explanatory view illustrating an operation of the liquid processing device.

At the time of supplying the TMSDMA gas, as illustrated in FIG. 5, the surface of the wafer W, which has been exposed and come in contact with the TMSDMA gas, is hydrophobized. The DIW which has been shaken off by action of a centrifugal force is scattered on the surface of the wafer W, remaining as fine droplets 81 which cause watermarks (schematically indicated by white circles in FIGS. 5 and 6).

Figure 6:
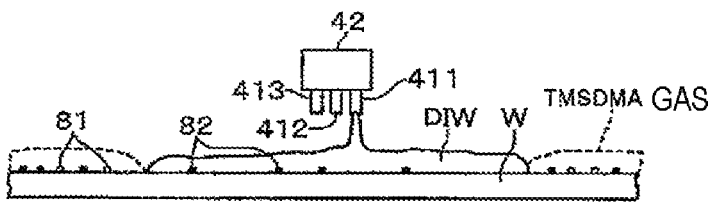
FIG. 6 is a third explanatory view illustrating an operation of the liquid processing device.
Figure 7:
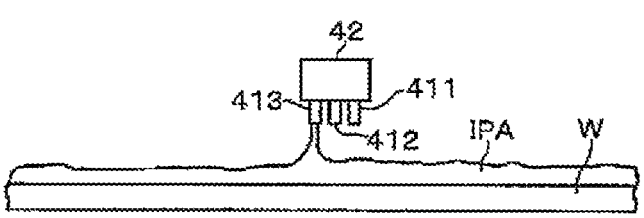
FIG. 7 is a fourth explanatory view illustrating an operation of the liquid processing device.

Accordingly, for a relatively short time before the fine droplets 81 are dried to form watermarks, the fluid supplied to the surface of the wafer W is switched to DIW (FIG. 6). When the DIW is supplied, the fine droplets 81 are washed away, thereby suppressing formation of the watermarks.

However, supply of the TMSDMA gas for a short time ranging from about 0.5 to 2 sec is not enough to give sufficient hydrophobicity up to the inside of a pattern over the entire surface of the wafer W. Accordingly, when the fine droplets 81 are washed away, the fluid supplied to the surface of the wafer W is switched to the TMSDMA gas. In this manner, the DIW and the TMSDMA gas are alternately supplied.

Hereinafter, hydrophobizing will be described in detail with reference to processes (a) to (e) of FIG. 9.

Figure 9:
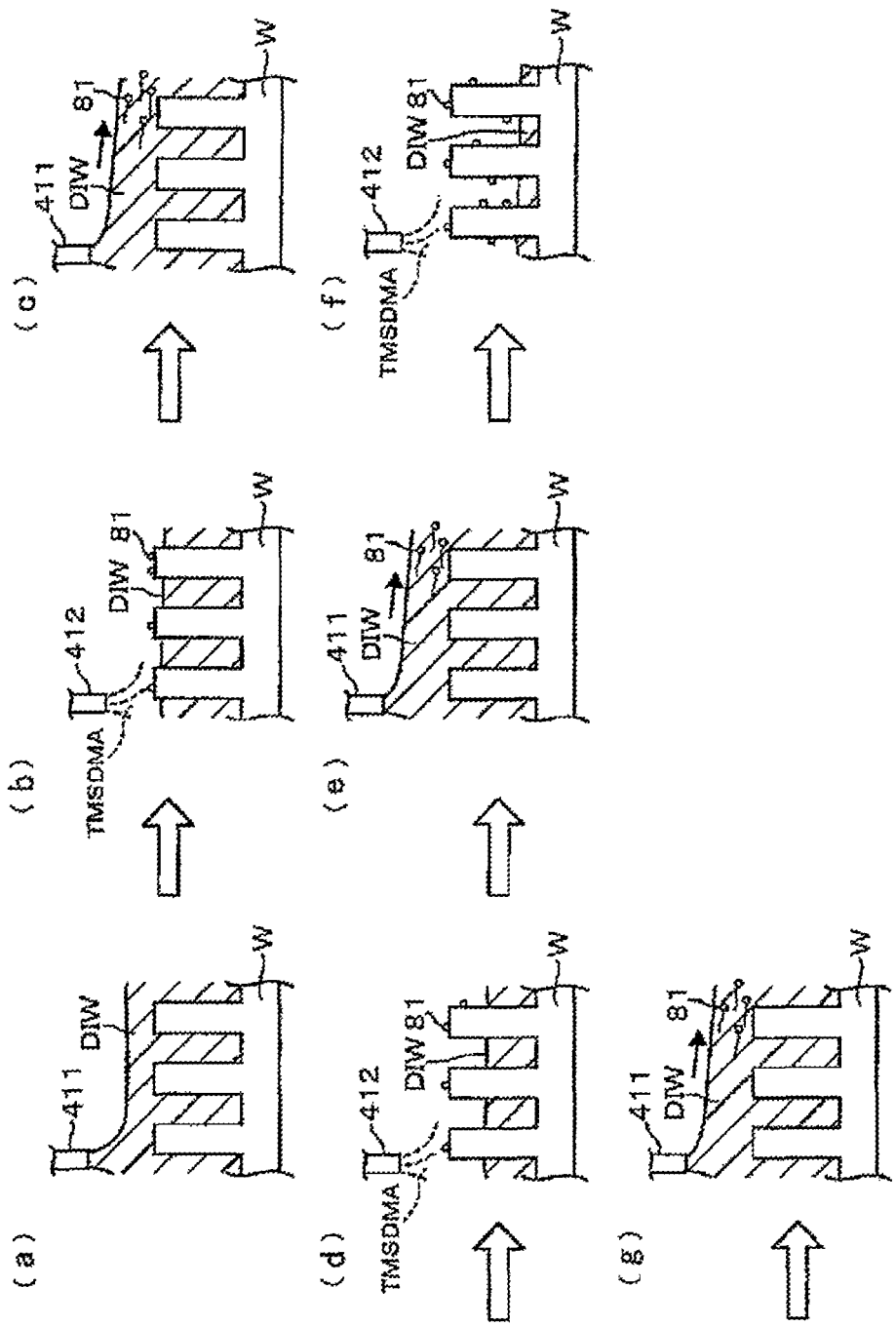
FIG. 9 is an explanatory view illustrating a state where a hydrophobized region is widened in a depth direction of a pattern.

First, DIW is supplied ((a) in FIG. 9). The supply of the DIW is stopped, and then TMSDMA gas is supplied to the surface of a wafer W while the wafer W covered with the DIW is rotated. Then, the TMSDMA gas comes in contact with an upper portion of a pattern from which a rinsing liquid is shaken off to hydrophobize the upper portion of the pattern ((b) in FIG. 9). Here, the DIW remains between patterns. Then, the DIW is supplied again. The wafer is covered with the DIW, and the DIW washes away fine droplets 81 which remain on the hydrophobized upper portion of the pattern ((c) in FIG. 9).

Subsequently, the supply of the DIW is stopped, and then the TMSDMA is supplied to the surface of the wafer W while the wafer W covered with the DIW is rotated. Then, from the upper portion of the pattern which has already been hydrophobized, the DIW rapidly flows away, and a liquid level of the DIW within the pattern is exposed. Further, when the DIW is shaken off so that the liquid level of the DIW within the pattern is lowered, the TMSDMA gas enters into the pattern, thereby hydrophobizig the side portion of the pattern ((d) in FIG. 9). Here, the DIW remains between the patterns. The fine droplets 81 generated at this time are washed away by the following supply of the DIW ((e) in FIG. 9).

Figure 10:
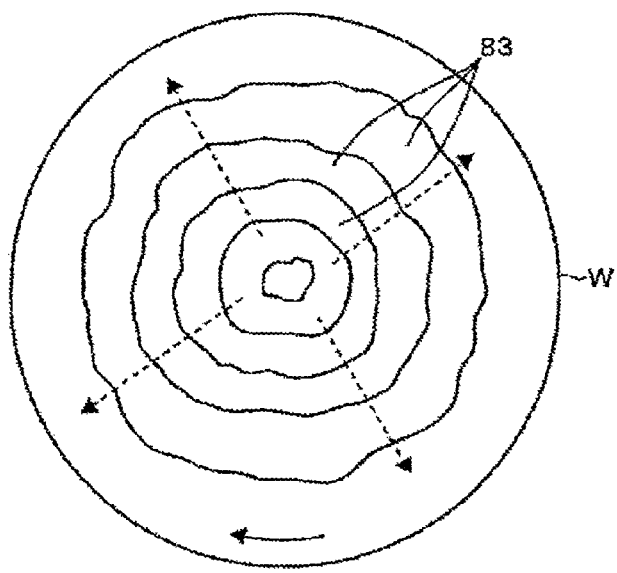
FIG. 10 is an explanatory view illustrating a state where a hydrophobized region is widened in a radial direction of a wafer.

When the supply of the DIW and the supply of the TMSDMA gas are alternately repeated as described above, the liquid level of the DIW within the pattern may be gradually lowered and the area of a hydrophobized region may be widened in a depth direction of the pattern as illustrated in processes (a) to (g) of FIG. 9. In a hydrophobized region 83 which has been hydrophobized up to the inside of a pattern, as schematically illustrated in FIG. 10, the liquid level of the DIW is gradually lowered from a wafer center to the radial outside, thereby gradually hydrophobizing the side portion of the exposed pattern. Accordingly, the hydrophobic gas is gradually spread in the radial direction of the wafer W. When the entire surface of the wafer W becomes the uniformly hydrophobized region 83 by repeating the alternate supply of the TMSDMA gas and the DIW, for example, several times to several hundred times, the alternate supply of the TMSDMA gas and the DIW is finished.

The alternate supply is repeatedly performed a number of times until it is possible to achieve hydrophobicity which allows the wafer W to be dried without causing pattern collapse. Whether the pattern collapse occurs may be evaluated based on, for example, a contact angle of the DIW with respect to the surface of the wafer W on which a pattern is not formed, and the number of times of repetition in which a contact angle ranging from 80° to 90° or more can be obtained is preferably selected.

When the hydrophobizing process of repeating alternate supply of the TMSDMA gas and the DIW is performed as described above, the hydrophobized region on the surface of a substrate may be gradually widened, and occurrence of watermarks may be suppressed.

Then, the DIW is removed to dry the wafer W (a period of "a rinsing and drying process" in section (b) of FIG. 3).

During the drying process, when the DIW is removed from the wafer W which has been rotated at a high speed, in some cases, the fine droplets 81 formed by scattering of the DIW may not be completely suppressed. Therefore, the liquid processing device of the present exemplary embodiment reduces the rotation speed of the wafer W to be in a range of about from 30 to 100 rpm, and moves a liquid nozzle 411 (a nozzle block 42) configured to supply the DIW from the central portion of the wafer W toward the circumferential edge (FIG. 8).

Due to the low-speed rotation of the wafer W, the DIW is spread in a circumferential direction of the wafer W while a liquid film formed by the DIW is maintained, and by the movement of the liquid nozzle 411, the region where the liquid pools may be pushed out toward the circumferential edge of the wafer W. As a result, it is possible to suppress the occurrence of droplets due to the scattering of the pooling liquid, and to widen a dried region which is not in contact with the DIW from the central portion of the wafer W to the circumferential edge. The DIW which has been pushed out is dropped at the circumferential edge of the wafer W from the wafer W, thereby being removed.

Figure 8:
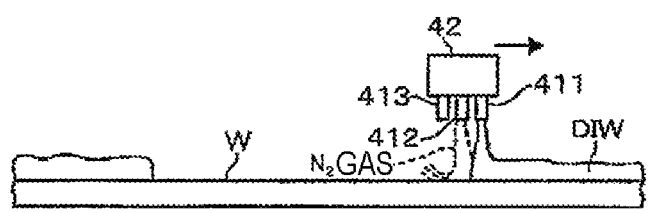
FIG. 8 is a fifth explanatory view illustrating an operation of the liquid processing device.

Here, as illustrated in FIG. 8, $N_2$ gas may be supplied from a gas nozzle 412 positioned closer to the center side of the wafer W than the liquid nozzle 411 configured to supply DIW (a period of "rinsing and drying" in section (d) of FIG. 3, and FIG. 8). The $N_2$ gas serves to flow away the DIW, so that the DIW which is supplied to the surface of the wafer W that is rotated at a low speed and thus is loaded with only a relatively small centrifugal force may be suppressed from remaining on the surface of the wafer W.

In this manner, when the liquid nozzle 411 reaches a more outside than the circumferential edge of the wafer W, the supply of the DIW is stopped, and then when the gas nozzle 412 reaches a more outside than the circumferential edge of the wafer W, the supply of the $N_2$ gas is stopped section (d) in FIG. 3). When the liquid nozzle 411 reaches the circumferential edge of the wafer W, a liquid splash hardly occurs due to low rotation speed of the wafer W even if a liquid flow of the DIW comes in contact with supporting pins 23. Thus, attachment of droplets to the surface of the wafer W may be suppressed.

When the scanning of the liquid nozzle 411 and the gas nozzle 412 is completed, the nozzle block 42 is retreated from the position above the wafer W, and the rotation of the wafer W is stopped. Then, the elevating plate 24 is moved up to raise the wafer W, and then the wafer W which has been processed is delivered to an external wafer conveyance mechanism, and the elevating plate 24 is moved down to await the carrying-in of a following wafer W.

The inventor has found that, when the above described hydrophobizing is completed by supplying the DIW, reaction byproducts 82 generated when the hydrophobic gas comes in contact with the DIW may remain on the surface of the wafer W (indicated by black circles in FIGS. 5 and 6), and the reaction byproducts 82 are difficult to remove by the DIW, but may be removed by IPA as a solvent.

Accordingly, it is more desirable that a solvent processing is performed between the hydrophobizing process and the drying process. That is, before the drying process and after the hydrophobizing process, IPA which is a solvent for removing the reaction byproducts 82 is supplied to the surface of the wafer W formed with a liquid film of the DIW (a period of "solvent processing" in section (e) of FIG. 3 and FIG. 7). As a result, from the surface of the wafer W, the reaction byproducts 82 are removed so that attachment and remaining of two kinds of particles generated by using the hydrophobic gas may be suppressed. The rotation speed of the wafer W when the IPA is supplied may be, for example, in a range from about 300 to 2000 rpm in which the When the hydrophobizing is completed by supplying the TMSDMA gas, the reaction byproducts 82 and the fine droplets 81 remain on the surface of the wafer W. However, since the fine droplets 81 are soluble in IPA, the solvent processing in section (e) of FIG. 3 and FIG. 7 may be performed after the TMSDMA gas is stopped.

The liquid processing device according to the present exemplary embodiment has the following effects. By alternately repeating the supply of a TMSDMA gas, and the supply of DIW to the surface of the wafer W, a hydrophobized region of the surface of the wafer W is gradually widened in a depth direction inside a pattern and a radial direction of the wafer. By the alternate supply of the TMSDMA gas and the DIW, fine droplets 81 generated at the time of supply of the TMSDMA gas may be washed away by the supply of the DIW.

Byproducts, which have been generated by supplying the TMSDMA gas to the surface of the wafer W after the chemical liquid was replaced by DIW, are removed by IPA. Thus, contamination of the wafer W by the byproducts may be reduced. After a processing liquid of the hydrophobized surface of the wafer W is replaced by DIW at the time of removing the DIW, the rotation speed of the wafer W is lowered and a liquid nozzle 411 configured to supply DIW is moved from the central portion side of the wafer W to the circumferential edge side. Thus, the wafer W may be dried while the DIW is suppressed from being scattered, taken in a liquid film, and pushed out to the circumferential edge side of the wafer W. Here, when $N_2$ gas is supplied from the central portion side of the wafer W, the DIW may be suppressed from being spread to the central portion side of the wafer W which rotates at a low speed.

Here, the silylating agent used as a hydrophobic agent is not limited to the TMSDMA. As other silylating agents that come in contact with DIW to generate reaction byproducts, for example, hexamethyldisilizane (HMDS) or trimethylsilyldiethylamine (TMSDEA) may be exemplified. IPA as a solvent may also be supplied to reaction byproducts generated by these silylating agents after hydrophobizing so as to suppress particle contamination of a wafer W.

The hydrophobic agent is not limited to the silylating agent as long as the hydrophobic agent generates reaction byproducts which are removable by a solvent, and the present disclosure may be employed in a case where other kinds of hydrophobic gases are used. As described above, a method of removing reaction byproducts by using a solvent is effective alone in reducing contamination of particles on a wafer W, and thus, may be employed in a process of drying a wafer by continuously supplying a hydrophobic gas.

Further, a solvent capable of removing reaction byproducts is not limited to IPA, and, for example, acetone may be used.

Hereinafter, descriptions will be made on removal of reaction byproducts when a wafer W is hydrophobized by using a liquid hydrophobic agent (e.g., a liquid silylating agent). In general, it is difficult to mix the liquid hydrophobic agent with DIW, and thus, as described in the following processing sequence, a hydrophobic agent and DIW are replaced with each other through the replacement by IPA.

An example of a processing sequence: (1) chemical liquid processing →(2) rinsing by DIW→(3) replacement of DIW by IPA→(4) replacement of IPA by liquid hydrophobic agent and hydrophobizing→(5) replacement of liquid hydrophobic agent by IPA→(6) replacement of IPA by DIW and rinsing→(7) removal of DIW(a drying process).

Meanwhile, a hydrophobic agent which can be easily mixed with DIW (water) has recently been developed. In this case, in terms of supplying the hydrophobic agent all over the entire surface of a wafer W after rinsing, the replacement process in step (3) becomes unnecessary. Likewise, in terms of supplying the DIW all over the entire surface of a wafer W after hydrophobizing, the replacement process in step (5) becomes unnecessary.

However, when the replacement process in step (3) is omitted, the hydrophobic agent may directly come in contact with the DIW, thereby generating a large amount of reaction byproducts. Accordingly, it can be said that even if the replacement process in step (3) is omitted, the IPA supply in step (5) is left so that the function of IPA as a solvent may be used to perform removal of the reaction byproducts.

For example, TMSDMA generates reaction byproducts by coming in contact with IPA. However, the reaction byproducts are removed through the solvent action of IPA in the above described example of a processing sequence, and thus are not problematic.

| Description of Symbols | |
|---|---|
| W: wafer | 21: support plate |
| 22: rotation shaft | 23: supporting pins |
| 411: liquid nozzle | 412: gas nozzle |
| 413: IPA nozzle | 81: fine droplets |
| 82: reaction byproducts | 83: hydrophobized region |

What is claimed is:

1. A liquid processing method using a liquid processing device which comprises a substrate holding unit configured to horizontally hold a substrate and to rotate the substrate around a vertical axis, a chemical liquid nozzle configured to supply a chemical liquid to a surface of the substrate, a hydrophobic gas nozzle configured to supply a hydrophobic gas to the surface of the substrate, and a rinsing liquid nozzle configured to supply a rinsing liquid to the surface of the substrate, the method comprising:
    supplying the chemical liquid from the chemical liquid nozzle to the surface of the substrate which is held and rotated by the substrate holding unit to perform a liquid processing;
    supplying the rinsing liquid from the rinsing liquid nozzle to the surface of the substrate while rotating the substrate to replace the chemical liquid by the rinsing liquid;
    hydrophobizing the substrate by alternately repeating supply of the hydrophobic gas for hydrophobizing the surface of the substrate to the surface of the substrate from the hydrophobic gas nozzle while rotating the substrate and supply of the rinsing liquid to the surface of the substrate while rotating the substrate after the hydrophobic gas is supplied; and
    drying the substrate by removing the rinsing liquid while rotating the substrate.

2. The liquid processing method of claim 1, wherein, during the hydrophobizing of the substrate, a following supply of the rinsing liquid is initiated before the rinsing liquid on the surface of the substrate, which is being supplied with the hydrophobic gas, is dried.

3. The liquid processing method of claim 1, wherein the substrate has a pattern formed on the surface of the substrate, and
    during the hydrophobizing of the substrate, the hydrophobic gas is caused to enter into the pattern while gradually lowering a position of a liquid level of the rinsing liquid present within the pattern formed on the substrate of the substrate so that an area of a hydrophobized region is gradually widened in a depth direction of the pattern.

4. The liquid processing method of claim 1, wherein the hydrophobizing of the substrate is completed by supplying the rinsing liquid to the surface of the substrate, and
    the number of revolutions of the substrate during the drying of the substrate is lower than the number of revolutions of the substrate during the hydrophobizing of the substrate.

5. The liquid processing method of claim 1, wherein the hydrophobizing of the substrate is completed by supplying the rinsing liquid to the surface of the substrate,
    the number of revolutions of the substrate during the drying of the substrate is lower than the number of revolutions of the substrate during the hydrophobizing of the substrate, and
    during the drying of the substrate, the rinsing liquid is supplied to the surface of the substrate which rotates while a supply position of the rinsing liquid is moved from a position above a central portion of the substrate toward a circumferential edge so that the rinsing liquid on the surface of the substrate is pushed out to outside of the substrate to be removed.

6. The liquid processing method of claim 1, further comprising:
removing byproducts of the hydrophobic gas by supplying a solvent to the surface of the substrate, between the hydrophobizing of the substrate and the drying of the substrate.

7. The liquid processing method of claim 1, wherein the substrate has a pattern formed on the surface of the substrate, and
the number of alternate repetitions of the supply of the rinsing liquid to the surface of the substrate and the supply of the hydrophobic gas to the surface of the substrate is set so that a contact angle of the rinsing liquid with respect to a surface portion of the substrate not formed with the pattern is a predetermined angle or more.

8. A computer-readable storage medium storing a computer program that, when executed, causes a liquid processing device configured to perform liquid processing on a surface of a substrate to execute the liquid processing method of claim 1.

9. A liquid processing device comprising:
a substrate holding unit configured to horizontally hold a substrate and to rotate the substrate around a vertical axis;
a chemical liquid nozzle configured to supply a chemical liquid to a surface of the substrate;
a hydrophobic gas nozzle configured to supply a hydrophobic gas to the surface of the substrate;
a rinsing liquid nozzle configured to supply a rinsing liquid to the surface of the substrate; and
a control unit configured to cause the liquid processing device to execute supplying the chemical liquid from the chemical liquid nozzle to the surface of the substrate which is held and rotated by the substrate holding unit, supplying the rinsing liquid from the rinsing liquid nozzle to the surface of the substrate while rotating the substrate, hydrophobizing the substrate by alternately repeating supply of the hydrophobic gas for hydrophobizing the surface of the substrate to the surface of the substrate from the hydrophobic gas nozzle while rotating the substrate and supply of the rinsing liquid to the surface of the substrate while rotating the substrate after the hydrophobic gas is supplied, and drying the substrate by removing the rinsing liquid while rotating the substrate holding unit to rotate the substrate.

10. The liquid processing device of claim 9, wherein, during the hydrophobizing of the substrate, the control unit causes a following supply of the rinsing liquid to be initiated before the rinsing liquid on the surface of the substrate, which is being supplied with the hydrophobic gas, is dried.

11. The liquid processing device of claim 9, wherein the control unit causes the hydrophobizing of the substrate to be completed by supplying the rinsing liquid to the surface of the substrate, and
sets the number of revolutions of the substrate during the drying of the substrate to be lower than the number of revolutions of the substrate during the hydrophobizing of the substrate.

12. The liquid processing device of claim 9, further comprising a solvent nozzle configured to supply a solvent to the surface of the substrate, and
the control unit causes the solvent to be supplied from the solvent nozzle to the surface of the substrate between the hydrophobizing of the surface of the substrate and the drying of the substrate.

* * * * *